United States Patent
Kitagawa et al.

(10) Patent No.: US 9,437,810 B2
(45) Date of Patent: Sep. 6, 2016

(54) MAGNETORESISTIVE ELEMENT AND MAGNETIC MEMORY

(71) Applicant: KABUSHIKI KAISHA TOSHIBA, Minato-ku (JP)

(72) Inventors: Eiji Kitagawa, Yokohama (JP); Takao Ochiai, Funabashi (JP); Kay Yakushiji, Tsukuba (JP); Makoto Konoto, Tsukuba (JP); Hitoshi Kubota, Tsukuba (JP); Shinji Yuasa, Tsukuba (JP); Takayuki Nozaki, Tsukuba (JP); Akio Fukushima, Tsukuba (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/193,340

(22) Filed: Feb. 28, 2014

(65) Prior Publication Data
US 2014/0264673 A1 Sep. 18, 2014

(30) Foreign Application Priority Data
Mar. 14, 2013 (JP) .................................. 2013-051933

(51) Int. Cl.
*H01L 29/82* (2006.01)
*H01L 43/10* (2006.01)
*H01L 43/08* (2006.01)
*H01L 27/22* (2006.01)

(52) U.S. Cl.
CPC ............. *H01L 43/10* (2013.01); *H01L 27/228* (2013.01); *H01L 43/08* (2013.01)

(58) Field of Classification Search
CPC ...................................................... H01L 43/10
USPC ......................................................... 257/421
See application file for complete search history.

(56) References Cited

U.S. PATENT DOCUMENTS

| | | | |
|---|---|---|---|
| 7,920,361 B2 | 4/2011 | Yoshikawa et al. | |
| 2007/0096229 A1 | 5/2007 | Yoshikawa et al. | |
| 2008/0291585 A1* | 11/2008 | Yoshikawa | B82Y 10/00 360/324.11 |
| 2009/0067232 A1 | 3/2009 | Korenivski | |
| 2009/0251951 A1 | 10/2009 | Yoshikawa et al. | |
| 2010/0330394 A1 | 12/2010 | He et al. | |
| 2011/0044099 A1 | 2/2011 | Dieny | |
| 2011/0141606 A1 | 6/2011 | Nishioka et al. | |
| 2012/0063221 A1* | 3/2012 | Yamane | B82Y 25/00 365/173 |
| 2012/0241881 A1* | 9/2012 | Daibou | H01L 43/10 257/421 |
| 2013/0249026 A1 | 9/2013 | Kitagawa et al. | |

FOREIGN PATENT DOCUMENTS

| | | |
|---|---|---|
| JP | 2010-109208 | 5/2010 |
| JP | 2010-147213 | 7/2010 |
| JP | 2011-124372 | 6/2011 |
| WO | 2010/067520 A1 | 6/2010 |

\* cited by examiner

*Primary Examiner* — Jamie C Niesz
(74) *Attorney, Agent, or Firm* — Oblon, McClelland, Maier & Neustadt, L.L.P.

(57) ABSTRACT

According to one embodiment, a magnetoresistive element includes a first magnetic layer having a variable magnetization direction; a second magnetic layer having an invariable magnetization direction; and a tunnel barrier layer provided between the first magnetic layer and the second magnetic layer and including an MgFeO film, wherein the MgFeO film contains at least one element selected from a group consisting of Ti, V, Mn, and Cu.

14 Claims, 6 Drawing Sheets

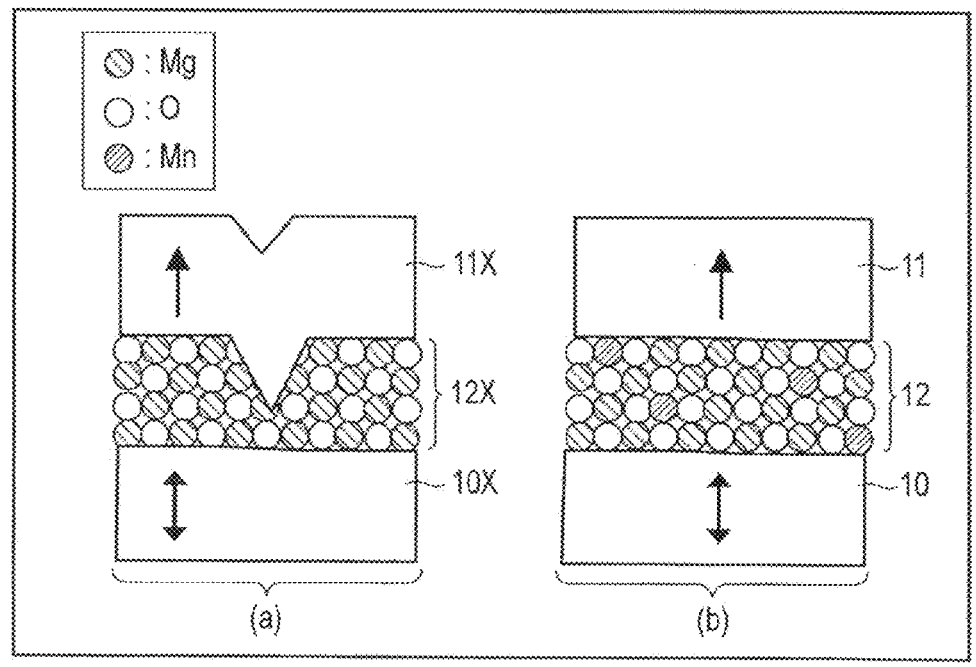
F I G. 4
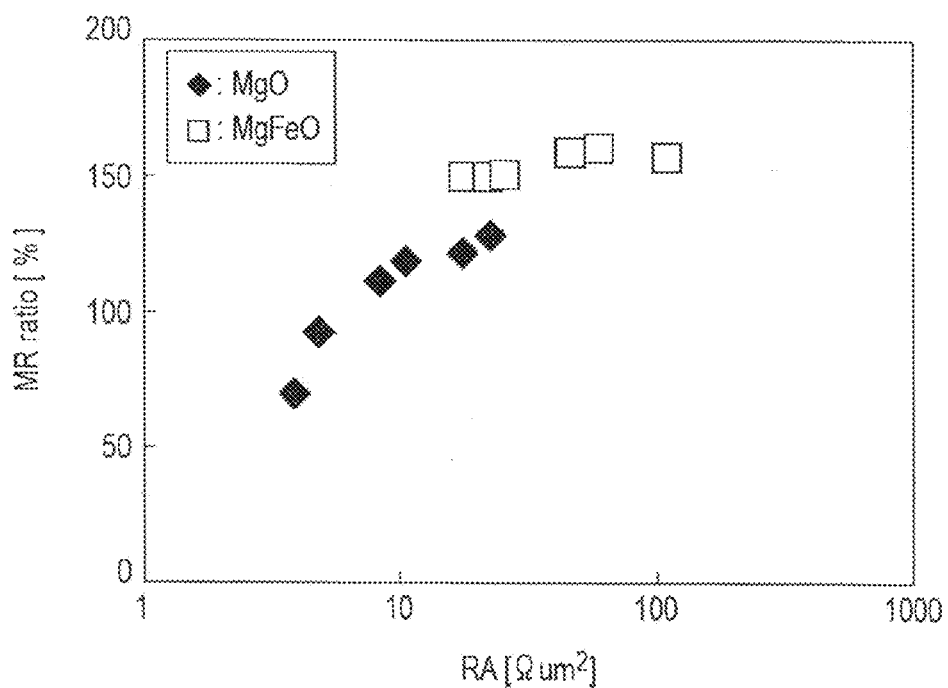
F I G. 5

MAGNETORESISTIVE ELEMENT AND MAGNETIC MEMORY

CROSS-REFERENCE TO RELATED APPLICATIONS

This application is based upon and claims the benefit of priority from Japanese Patent Application No. 2013-051933, filed Mar. 14, 2013, the entire contents of which are incorporated herein by reference.

FIELD

Embodiments described herein relate generally to a magnetoresistive element and a magnetic memory.

BACKGROUND

To realize a magnetic memory utilizing a tunnel magneto resistive (TMR) element, various technologies have been suggested.

As one of such technologies, there is a system that records data "1" or "0" in a magnetic tunnel junction (MTJ) element in association with a magnetization alignment state of the element and reads the data based on a difference in resistance value of the element due to the TMR effect.

As a system that writes data into a magnetic memory, i.e., reverses magnetization of a magnetic layer of the MTJ element, a magnetization reversal system (which will be referred to as a spin injection magnetization reversal system hereinafter) that is caused by allowing a spin polarized current to flow through an MTJ element is attracting attention in terms of miniaturization of the element and reduction in current.

Development of a magnetic memory adopting a spin injection magnetization reversal system (e.g., an MRAM) has been promoted as a memory that enables reduction in power consumption, a high-speed operation, and increase in capacity.

BRIEF DESCRIPTION OF THE DRAWINGS

FIG. 4 is a view schematically showing a growth model of a film included in the MTJ element.

FIG. 5 is a view showing element characteristic of the magnetoresistive element according to the embodiment;

DETAILED DESCRIPTION

Embodiment

Figure 1:
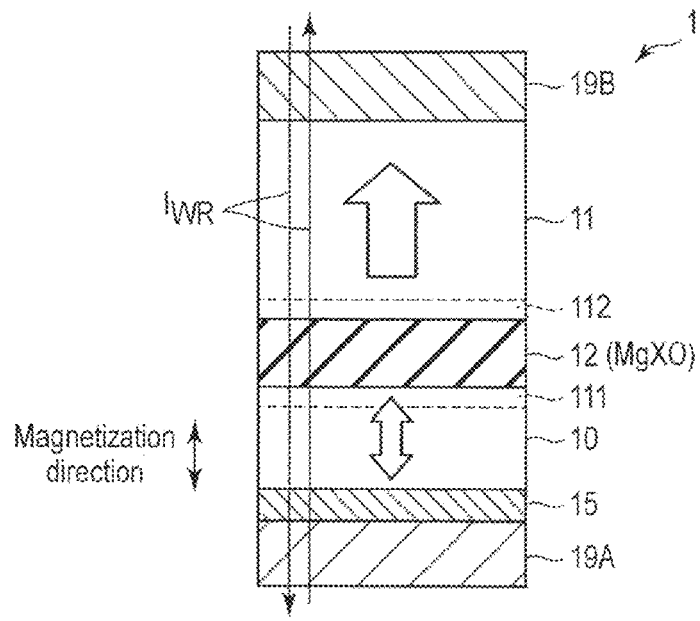
FIG. 1 is a view showing a configuration of a magnetoresistive element according to an embodiment.

This embodiment will now be described hereinafter in detail with reference to the accompanying drawings. In the following description, like reference numerals denote elements having the same functions and configurations, and an overlapping description will be given as required.

In general, according to one embodiment, a magnetoresistive element includes a first magnetic layer having a variable magnetization direction; a second magnetic layer having an invariable magnetization direction; and a tunnel barrier layer provided between the first magnetic layer and the second magnetic layer and including an MgFeO film, wherein the MgFeO film contains at least one element selected from a group consisting of Ti, V, Mn, and Cu.

(1) Configuration

A configuration of a magnetoresistive element according to an embodiment will now be described with reference to FIG. 1.

FIG. 1 is a schematic view showing a cross-sectional configuration of a magnetoresistive element according to the embodiment.

As shown in FIG. 1, a magnetoresistive element (which is also referred to as a magnetoresistive effect element) 1 according to this embodiment includes two magnetic layers 10 and 11 between two electrodes 19A and 19B of the element 1. A tunnel barrier layer (intermediate layer) 12 is provided between the two magnetic layers 10 and 11.

In this embodiment, the two magnetic layers 10 and 11 and the tunnel barrier layer 12 form a magnetic tunnel junction (MTJ). The magnetoresistive element 1 according to this embodiment will be referred to as an MTJ element 1 hereinafter.

As constituent members of the MTJ element 1, the lower electrode 19A, an underlying layer 15, the magnetic layer 10, the tunnel barrier layer 12, the magnetic layer 11, and the upper electrode 19B are stacked from a substrate side in a direction vertical to a substrate surface in the mentioned order. It is to be noted that the MTJ 1 in FIG. 1 has a configuration of the MTJ element using perpendicular magnetic anisotropy, and an MTJ element using in-plane magnetic anisotropy may be adopted as the MTJ element 1. In this case, as a configuration of the MTJ element 1 with in plane magnetic anisotropy, a lower electrode, a buffer layer, an antiferromagnetic layer, an antiparallel coupling magnetic layer, a tunnel barrier layer, a magnetic layer, and an upper electrode are stacked from a substrate side in the mentioned order. It is to be noted that the constituent members of the MTJ element may be stacked in the opposite order.

It is preferable to use a material having low electrical resistance and preventing atom (element) diffusion for the lower electrode 19A and the upper electrode 19B. For example, for the lower electrode 19A and the upper electrode 19B, one selected from materials which are tantalum (Ta), titanium (Ti), tantalum nitride (TaN), titanium nitride (TiN), and a stacked film of these substance is used. Iridium (Ir) or ruthenium (Ru) may be used for the lower electrode 19A. For example, a stacked film of Ta/copper (Cu)/Ta is used for the lower electrode 19A and the upper electrode 19B.

The upper electrode 19B of the MTJ element 1 may be used as a hard mask for processing the MTJ element 1 into a predetermined shape. The lower electrode 19A may have a function as an underlying layer. The lower electrode 19A of the MTJ element 1 is provided on the substrate (not shown).

A magnetization direction of the magnetic layer 10 is variably set. The magnetic layer 10 having the variable magnetization direction is provided on the lower electrode 19A to sandwich the underlying layer 15 therebetween. The magnetic layer 10 having the variable magnetization direction will be referred to as a recording layer (or a storage layer, a free layer, or a magnetization free layer) hereinafter.

For example, as the recording layer 10, a magnetized film containing at least one of cobalt (Co), iron (Fe), and boron (B) is used. For example, for the recording layer 10, CoFeB/Ta/Co is used. It is to be noted that, when a stacked film made of a layer A and a layer B is represented as A/B, this means that the layer A corresponding to the left side of "/" is stacked on the layer B corresponding to the right side of "/".

The underlying layer 15 is provided in the MTJ element 1 in such a manner that the underlying layer 15 is in contact with the recording layer 10. For example, the underlying layer 15 is provided between the recording layer 10 and the lower electrode 19A, and it is provided on the opposite side of a side of the recording layer 10 on which the tunnel barrier layer 12 is provided.

To improve magnetization characteristics of the recording layer 10, a material having an atomically close-packed plane may be used for the underlying layer 15 in accordance with a material of the recording layer 10. For example, Pt (platinum), Pd (palladium), Ir, or Ta is used for the underlying layer 15 as a material having an atomically close-packed plane. Alternatively, to reduce a damping constant of the recording layer 10, a material having a small spin pumping effect caused between the recording layer 10 and the underlying layer 15 may be used. A nitride or a boride is used for the underlying layer 15 as a material having a small spin pumping effect.

For example, when a CoFeB/Ta/Co stacked film is used for the recording layer 10 and a Ta film is used for the underlying layer 15, a magnetic layer (a recording layer) having perpendicular magnetic anisotropy can be formed.

When writing data into the MTJ element as a memory element using STT is taken into consideration, to reduce a write current, using a material having a small damping constant for the recording layer 10 is preferable. That is, it is desired to reduce spin pumping caused between the recording layer 10 and the underlying layer 15 and decrease a damping constant of the recording layer 10. For example, considering a combination of the recording layer 10 and the underlying layer 15 enables to reduce a damping constant of the recording layer 10 and decrease a write current.

A magnetization direction of the magnetic layer 11 is set to a fixed state (an invariable state). The magnetic layer 11 whose magnetization direction is in the fixed state is stacked above the recording layer 10 through the tunnel barrier layer 12. The magnetic layer 11 whose magnetization direction is invariable will be referred to as a reference layer (or a magnetization invariable layer, a fixed layer, or a fixing layer) hereinafter.

To form a magnetized film having perpendicular magnetic anisotropy, a film containing a ferrimagnetic substance as a main component, e.g., a TbCoFe film is used for the reference layer 11.

Furthermore, an interface layer 112 may be provided between the reference layer 11 and the tunnel barrier layer 12. The interface layer 112 is a magnetic layer that is in contact with the tunnel barrier layer 12. For example, when a CoFeB film as the interface layer is interposed between the TbCoFe film 11 as the reference layer and the tunnel barrier layer 12, a high MR ratio of the magnetoresistive element can be obtained.

An interface layer 111 may be provided near an interface between the recording layer 10 and the tunnel barrier layer 12. When a CoFeB/Ta/Co stacked film is used for the recording layer 10, a CoFeB film to the tunnel barrier layer 12 side has a function as the interface layer. It is to be noted that not only the magnetic layer provided separately from the recording layer 10 and the reference layer 11 but also a portion (a region) of the recording layer 10 or the reference layer 11 that is in contact with the tunnel barrier layer 12 may be referred to as an interface layer. The interface layer 111 or 112 alleviates lattice mismatch of the tunnel barrier layer 12 and the magnetic layer 10 or 11 and improves crystallinity of the tunnel barrier layer 12 and the magnetic layer 10 or 11. As a result, characteristics (e.g., an MR ratio) of the MTJ element are improved. For example, the interface layer is formed by using a magnetic layer containing at least two elements selected from a group including cobalt (C), iron (Fe), and boron (B). However, a material of the interface layer is not restricted to a magnetic layer containing Co, Fe, or B.

Moreover, the MTJ element 1 may include a shift adjustment layer (not shown) having a magnetization direction opposite to the magnetization direction of the reference layer 11. The shift adjustment layer (which is also referred to as a bias layer or a shift cancelation layer) substantially zeroes a magnetostatic leakage field produced from the reference layer 11 and suppresses generation of a shift magnetic field in the recording layer 10 due to the magnetostatic leakage field from the reference layer 11. For example, the shift adjustment layer is provided on the opposite side (an opposed surface) of a side (a surface) of the reference layer 11 on which the tunnel barrier layer 12 is provided.

When each of the magnetic layers (the recording layer and the reference layer) 10 and 11 included in the MTJ element is a perpendicular magnetization film, the perpendicular magnetic anisotropy of the magnetic layer is formed by utilizing, e.g., crystal magnetic anisotropy or interface magnetic anisotropy of a magnetic substance (the magnetic layer).

In the perpendicular magnetization type MTJ element 1 utilizing the crystal magnetic anisotropy, since a c-axis of a crystal corresponds to a direction perpendicular to a film surface, even if each crystal grain rotates in an in-plane direction of a film, the c-axis of the crystal maintains the perpendicular direction relative to the film surface without dispersing. Therefore, the perpendicular magnetic film utilizing the crystal magnetic anisotropy can suppress dispersion of a crystal axis. Additionally, a magnetic layer having the perpendicular magnetic anisotropy based on the interface magnetic anisotropy can suppress dispersion of a crystalline orientation.

For example, a Co—Cr alloy, an Fe—Pt ordered alloy, an Fe—Pd ordered alloy, a Co—Pt ordered alloy, an Fe—Co—Pt ordered alloy, an Fe—Ni—Pt ordered alloy, an Fe—Ni—Pd ordered alloy, or an artificial lattice structure in which Co as a magnetic substance and Pt (or Pd) as a non-magnetic substance are alternately stacked may be used for each of the recording layer and the reference layer.

It is to be noted that the description "the magnetization direction of the reference layer is in the fixed state" or "the magnetization direction of the reference layer is invariable" means that the magnetization direction of the reference layer 11 does not change when a current equal to or above a magnetization reversal threshold value for reversing the magnetization direction of the recording layer 10 has flowed through the reference layer 11.

Therefore, in the MTJ element 11, a magnetic layer having a high magnetization reversal threshold value is used as the reference layer 11, and a magnetic layer having a smaller magnetization reversal threshold value than the reference layer 11 is used as the recording layer 10. As a result, the MTJ element 1 including the recording layer 10 having the variable magnetization direction and the reference layer 11 having the fixed magnetization direction is formed.

When the MTJ element 1 is used for a memory element in a magnetic memory, data is written into the MTJ element 1 as the memory element by STT. A write current $I_{WR}$ used for reversing the magnetization direction of the recording layer 10 has a higher current value than the magnetization reversal threshold value of the recording layer 10 and also has a smaller current value than the magnetization reversal threshold value of the reference layer 11.

In the case of executing writing data into the MTJ element 1 by using the STT, a current is allowed to bi-directionally flow through the MTJ element 1.

When the magnetization direction of the recording layer 10 is set to be parallel (P) to the magnetization direction of the reference layer 11, i.e., when the magnetization direction of the recording layer 10 is set to be equal to the magnetization direction of the reference layer 11, the current $I_{WR}$ flowing from the recording layer 10 toward the reference layer 11 is supplied to the MTJ element 1.

A spin angular momentum (spin torque) of a spin-polarized electron whose direction is the same as the magnetization (spin) direction of the reference layer is applied to the magnetization (the spin) of the recording layer 10, and the magnetization of the recording layer 10 is reversed to be equal to the magnetization direction of the reference layer 11. When the magnetization alignment of the MTJ element 1 is parallel alignment (a parallel state), the MTJ element 1 has the lowest resistance value.

When the magnetization direction of the recording layer 10 is set to be antiparallel (AP) to the magnetization direction of the reference layer 11, i.e., when the magnetization direction of the recording layer 10 is set to be opposite to the magnetization direction of the reference layer 11, the current $I_{WR}$ flowing from the reference layer 11 toward the recording layer 10 is supplied to the MTJ element 1.

The spin torque of the spin-polarized electron having the spin that is reflected by the reference layer 11 and antiparallel to the magnetization direction of the reference layer 11 is applied to the magnetization of the recording layer 10, and the magnetization of the recording layer 10 is reversed to be opposite to the magnetization direction of the reference layer 11. When the magnetization alignment of the MTJ element 1 is antiparallel alignment (an antiparallel state), the MTJ element 1 has the highest resistance value.

When the MTJ element 1 is used as a memory element in a magnetic memory, for example, the MTJ element 1 in a state that its resistance value is small (a state that the magnetization alignment is parallel) is associated with a data "0" holding state, and the MTJ element 1 in a state that its resistance value is high (a state that the magnetization alignment is antiparallel) is associated with a data "1" holding state.

In the case of determining a resistance state in the MTJ element 1 according to this embodiment, which one of the data "0" holding state or the data "1" holding state the MTJ element is in can be determined by allowing a current to flow through the MTJ element 1. The intensity of a signal (a read output, a read signal) based on a read current (or a resistance determination current), which is used for determining a resistance state, flowing through the MTJ element 1 fluctuates in accordance with a resistance value of the MTJ element 1. A fluctuation in read signal is detected and amplified, and a data holding state of the MTJ element as the memory element is determined.

As described above, when the MTJ element 1 is used as the memory element in a magnetic memory, data stored in the MTJ element as the memory element is read by allowing a current to flow through the MTJ element 1.

It is to be noted that a current value of the read current is set to a smaller value than a current value (the magnetization reversal threshold value) of the write current $I_{WR}$ so that the magnetization of the recording layer 10 cannot be reversed by the read current.

The tunnel barrier layer 12 is provided between the recording layer 10 and the reference layer 12.

In this embodiment, the tunnel barrier layer 12 is an oxide film containing an oxide (e.g., MgO) of magnesium (Mg).

MgO has a crystal structure which is a sodium chloride (NaCl) type structure. When a material having the NaCl type structure like MgO is used for the tunnel barrier layer 12, an MgO film as the tunnel barrier layer 12 is crystalline-oriented. For example, it is preferable for the MgO film to be priority-oriented with respect to an fcc (001) plane (or orientation) and a plane (or an orientation) equivalent thereto.

In this embodiment, the film 12 as the tunnel barrier layer containing MgO as a main component contains at least one type of impurity X. The MgO film as the tunnel barrier layer 12 contains at least one of titanium (Ti), vanadium (V), iron (Fe), manganese (Mn), copper (Cu), and boron (B).

As a more specific example, in the MTJ element 1 according to this embodiment, the MgO film as the tunnel barrier layer 12 contains as the impurity X at least one element selected from a group including Ti, V and Mn.

Alternatively, in the MTJ element 1 according to this embodiment, an MgFeO film as the tunnel barrier layer 12 contains at least one element selected from a group including Ti, V, Mn, Cu, and B.

The MTJ element including the tunnel barrier layer having these impurities added thereto (e.g., MgMnO, MgFeO, or MgFeMnO) is formed by depositing the magnetic layers 10 and 11 and the tunnel barrier layer 12 by, e.g., a sputtering method.

For example, the tunnel barrier layer 12 is deposited on the magnetic layer by the sputtering method. For example, when a metal (alloy) target of Mg and an impurity X having a predetermined composition ratio or an oxide (metal oxide) target of Mg and the impurity X having a predetermined composition ratio is sputtered using oxygen and argon, a tunnel barrier layer having a metal oxide containing Mg and the impurity X as a main component is formed. A stacked structure including this tunnel barrier layer is processed into a predetermined shape by ion milling using the upper electrode as a hard mask, and the MTJ element according to this embodiment is formed.

As described above, in the MTJ element according to this embodiment, a film containing as a main component MgO which contains at least one element selected from Ti, V, and Mn is used for the tunnel barrier layer. Alternatively, in the MTJ element according to this embodiment, a film containing as a main component MgFeO which contains at least one element selected from Ti, V, Mn, Cu, and B is used for the tunnel barrier layer. As a result, element characteristics of the MTJ element according to this embodiment are improved.

(b) Element Characteristics

Element characteristics of the magnetoresistive element (the MTJ element) according to the embodiment will now be described with reference to FIG. 2 to FIG. 6.

A description will be given as to an improvement in the element characteristics of the MTJ element when one or more selected from Mn, Ti, V, and Cu are added to the MgO film as the tunnel barrier layer with reference to FIG. 2 to FIG. 4.

Figure 2:
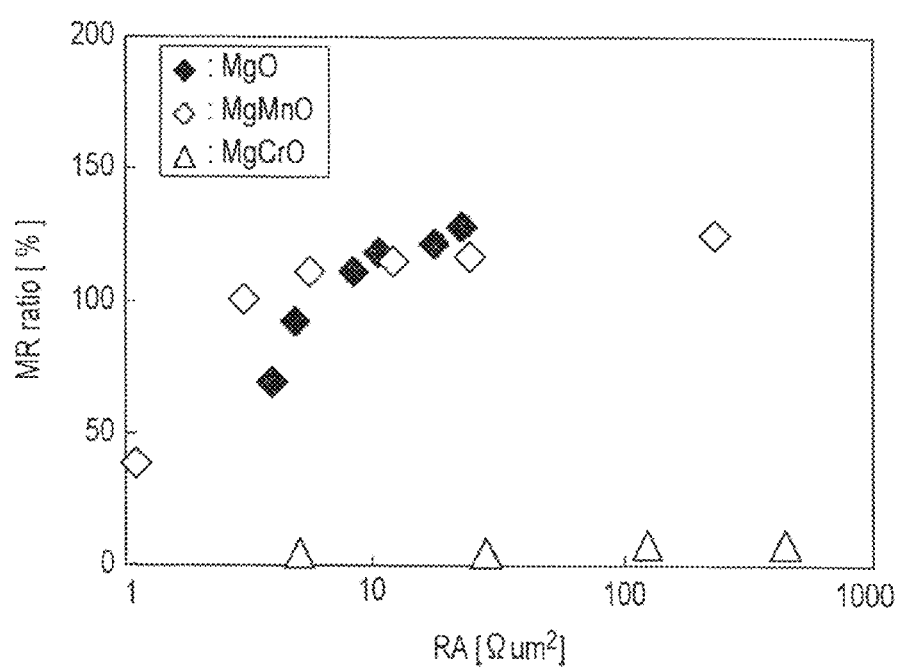
FIG. 2 is a view showing element characteristics of the magnetoresistive element according to the embodiment.

FIG. 2 is a graph showing characteristics of the MTJ element according to this embodiment.

An abscissa in FIG. 2 represents a resistance-area product RA (a unit: $\Omega\mu m^2$) on a Log scale. An ordinate in FIG. 2 represents an MR ratio (a unit: %) of the MTJ element.

FIG. 2 shows characteristics of the MTJ element when each of a film in which MnO is added to MgO (MgMnO) and a film in which CrO is added to MgO (MgCrO) is used for the tunnel barrier layer. The tunnel barrier layer including the MgMnO film or the MgCrO film is formed by the sputtering method using each of an MgMnO target and an MgCrO target.

As the MgMnO target configured to form the tunnel barrier layer of the MgMnO film, there is used a target in which a composition of Mg and Mn is adjusted so that a composition of Mn relative to Mg becomes a composition ratio of Mg:Mn=4:1 (here, an atomic ratio).

As the MgCrO target configured to form the tunnel barrier layer of the MgCrO film, there is used a target in which a composition of Mg and Cr is adjusted so that a composition of Cr relative to Mg becomes a composition ratio of Mg:Cr=4:1 (here, an atomic ratio).

The MgMnO film and the MgCrO film each of which is the tunnel barrier layer of the MTJ element 1 are formed with use of these targets by the sputtering method adopting an RF cathode.

A Ta/CoFeB/MgXO (X=Mn or Cr)/CoFeB/Ru/CoFe/PtMn/Ta structure is used for the measured MTJ element as an MTJ element having a magnetic layer with the in-plane magnetic anisotropy. FIG. 2 shows element characteristics of the MTJ element using the MgO film having no impurity added thereto.

As shown in FIG. 2, when the MgO film is used for the tunnel barrier layer, when the resistance-area product RA of this MTJ element becomes 10 $\Omega\mu m^2$ or less, the MR ratio of the MTJ element including the MgO film as the tunnel barrier layer is precipitously reduced.

On the other hand, when the MgMnO film is used for the tunnel barrier layer, even if the resistance-area product RA of this MTJ element is less than 10 $\Omega\mu m^2$, a reduction in MR ratio of the MTJ element including the MgMnO film as the tunnel barrier layer is smaller than a reduction in the same of the MTJ element including the MgO film as the tunnel barrier layer.

Therefore, in the MTJ element including the MgMnO film as the tunnel barrier layer, the MR ratio of the MTJ element can be increased in a region where the resistance-area product RA is small.

On the other hand, as shown in FIG. 2, in the MTJ element using the MgCrO film as the tunnel barrier layer, the MR ratio is low as a whole, and the MTJ element having the small resistance-area product RA cannot obtain the high MR ratio.

A reason why the MTJ element can obtain the high MR ratio with a low resistance value will now be described with reference to FIG. 3.

Figure 3:
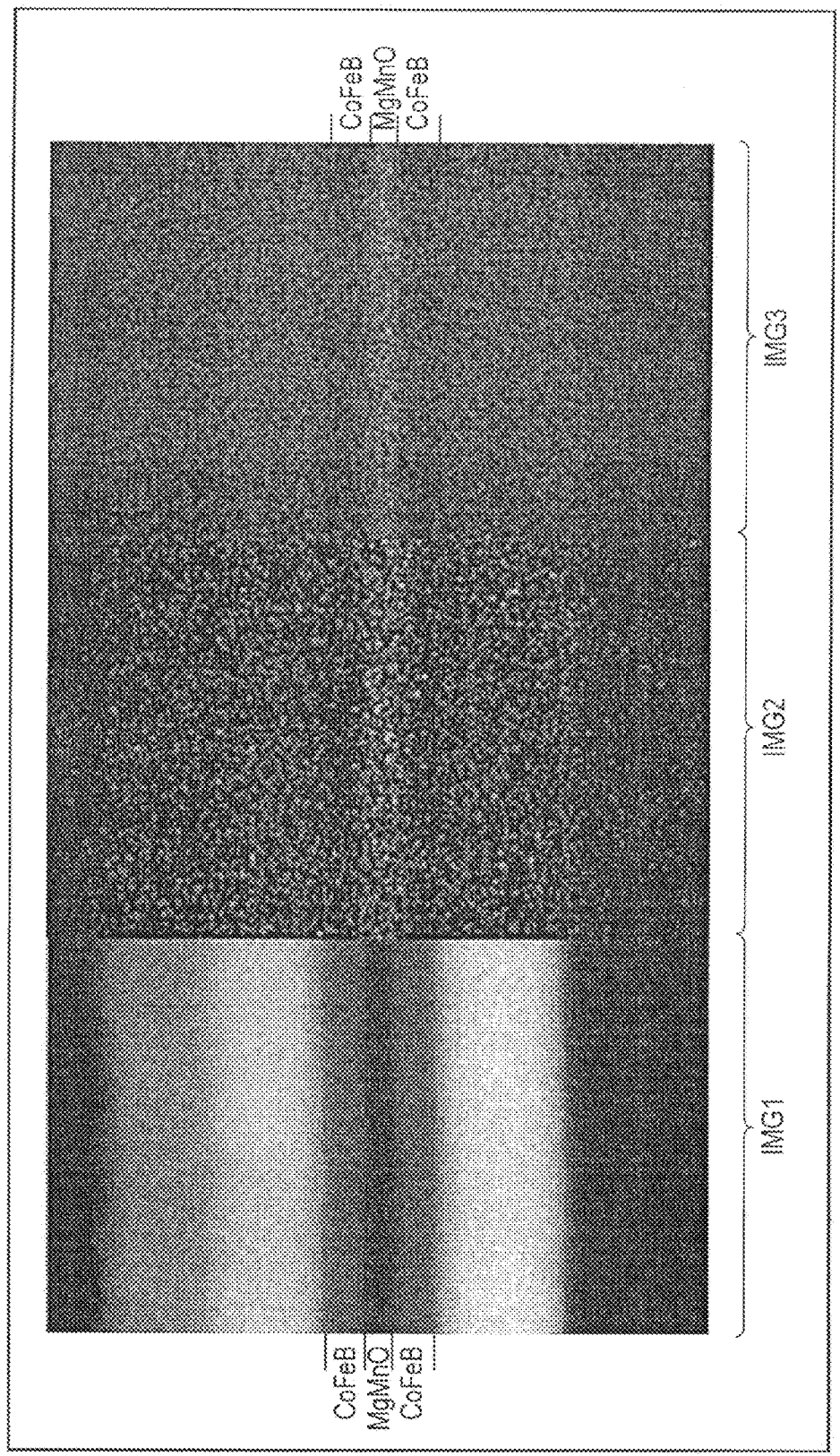
FIG. 3 is a view showing an analysis result of the magnetoresistive element according to the embodiment.

FIG. 3 shows a result of a scanning transmission electron microscope (STEM) for the MTJ element according to this embodiment. Here, a magnetic tunnel junction used for the STEM analysis has a CoFeB/MgMnO/CoFeB structure (a stacked film).

An analysis result IMG1 in FIG. 3 shows a high-angle annular dark-field (HAADF) image of the CoFeB/MgMnO/CoFeB structure.

An analysis result IMG2 in FIG. 3 shows a characteristic X-ray signal of a K shell of Mn in the CoFeB/MgMnO/CoFeB structure analyzed by energy dispersive X-ray spectroscopy (EDX). Each white point in the analysis result (an EDX image) IMG2 shows the characteristic X-ray signal of the K shell of Mn.

An analysis result IMG3 in FIG. 3 shows a characteristic X-ray signal of a K shell of Mg in the CoFeB/MgMnO/CoFeB structure analyzed by the EDX. Each white point in the analysis result (the EDX image) IMG 3 shows the characteristic X-ray signal of the K-shell of Mg.

In the analysis result IMG1 in FIG. 3, the darkest part at the center in the HAADF image represents MgMnO.

In each of the analysis results IMG2 and IMG3, the characteristic X-ray signal (the white point in each of analysis results IMG2 and IMG3) of Mn or Mg analyzed by the EDX is detected in the same straight line with a position of MgMnO in the HAADF image.

It can be confirmed from these analysis results IMG1, IMG, and IMG3 that MgMnO is formed in the CoFeB/MgMnO/CoFeB structure.

Based on a well-known MgO—MnO-type state diagram, when MgMnO is formed by a sputtering apparatus that can realize an ultra-high vacuum state, MgMnO is generated in a low-oxygen state, and MgO and MnO are formed in a complete solid solution. That is, it can be considered that an Mg site in the film is substituted by Mn and MgMnO is formed.

Further, when MgO turns to MgMnO, a melting point of the film is lowered.

Like Mn, a material (an element) that forms a complete solid solution with MgO and lowers a melting point of the film when Mg substitutes for the added atom is added to the MgO film, whereby the nucleus formation energy of the tunnel barrier layer containing MgO as a main component and a critical radius required for forming a crystal grain on the initial stage of formation of the tunnel barrier layer (the film containing MgO as a main component) are reduced.

FIG. 4 schematically shows growth of a film included in the MTJ element that includes the tunnel barrier layer containing MgO as a main component. (a) in FIG. 4 schematically shows a growth state of the film included in the MTJ element when the MgO film is used for the tunnel barrier layer. (b) in FIG. 4 schematically shows a growth state of the film included in the MTJ element when the MgMnO film is used for the tunnel barrier layer.

As shown in (a) in FIG. 4, when the MgO film is used for a tunnel barrier layer 12X, since the MgO film 12X has a large nucleus formation energy, a critical radius of a crystal grain increases, and the size of the crystal grains of the film increases. As a result, the MgO film 12X having high irregularity (poor flatness) is formed. The ununiformity of the film becomes prominent as a film thickness of the MgO film is reduced. Therefore, when the film thickness of the MgO film is reduced to decrease the resistance of the MTJ film, the flatness of the MgO film is deteriorated. The film quality/film thickness of a magnetic layer deposited on the MgO film 12X becomes uneven due to the ununiformity of the MgO film.

As shown in (b) in FIG. 4, when the MgMnO film is used for the tunnel barrier layer 12, growth of the crystal grain of the MgMnO film as the tunnel barrier layer is suppressed. As a result of the suppression of growth of the crystal grain, the MgMnO film containing fine crystals (or an amorphous phase) is formed. Consequently, the MgMnO film 12 having high flatness is formed on the magnetic layer 10. The flat magnetic layer 11 can be formed on the MgMnO film having the high flatness (uniformity).

As described above, when Mn (or Ti, V, Fe, or Cu) is added to MgO, formation of fine crystals in the tunnel barrier layer is promoted, and the ununiformity of the tunnel barrier layer is improved. As a result, in the MTJ element 1 having the MgMnO film used for the tunnel barrier layer, deterioration of the MR ratio of the MTJ element caused on the low-resistance side can be suppressed.

On the other hand, when CrOx (a chrome oxide) is added to MgO, a mixed crystal state of MgO and CrOx is formed based on a well-known MgO—CrO type state diagram.

When spin tunnels in CrOx having low resistance in the film and at a grain boundary of MgO and CrOx in the film, a Δ1 band effect intrinsic to MgO cannot be obtained, whereby the MR ratio of the MTJ element is deteriorated.

In an MTJ element using one of MgCuO, MgTiO, and MgVO for the tunnel barrier layer, like the MTJ element including the tunnel barrier layer using the MgMnO film, deterioration of an MR ratio of the MTJ element can be suppressed in a region where a resistance-area product RA of the tunnel barrier layer 12 of the MTJ element is 10 $\Omega\mu m^2$ or less. Further, irrespective of MgCuO, MgTiO, and MgVO, when a material that has complete solid solubility relative to MgO and lowers a melting point of MgO is contained in MgO, the same effect as a tunnel barrier using MgMnO can be obtained. However, to obtain the effect of a high MR ratio of the MTJ element based on the Δ1 band effect intrinsic to MgO, it is desirable to set a material (an element X) that substitutes for Mg in MgO to 50 atomic % or less with respect to Mg. It is to be noted that concentration of X in the MgXO film is 25 atomic % or less in this case.

It is to be noted that, even if the MgO film in which two or more elements selected from Mn, Ti, V, and Cu is used for the tunnel barrier layer of the MTJ element, substantially the same effect can be obtained.

As described above, when at least one of Mn, Ti, V, and Cu is added to the MgO film as the tunnel barrier layer, the element characteristics of the MTJ element can be improved.

A description will now be given as to an improvement in the element characteristics of the MTJ element when Fe is added to the MgO film as the tunnel barrier layer with reference to FIG. 5 and FIG. 6.

The element characteristics of the MTJ element when MgO having Fe added thereto is used for the tunnel barrier layer will now be described with reference to FIG. 5.

FIG. 5 shows a measurement result of a resistance-area product RA of an MTJ element in which an MgFeO film is used for the tunnel barrier layer and an MR ratio of the MTJ element.

An abscissa in FIG. 5 represents a resistance-area product RA (a unit: $\Omega\mu m^2$) of the MTJ element on a Log scale. An ordinate in FIG. 5 represents an MR ratio (a unit: %) of the MTJ element.

As described above, in the MTJ element including the tunnel barrier layer having MnO added to MgO, the MR ratio of the MTJ element can be prevented from lowering in a region where the resistance-area product RA of the MTJ element is small (e.g., a region of 10 $\Omega\mu m^2$ or less).

As shown in FIG. 5, when a tunnel barrier layer having FeO (Fe) added to MgO is used for the MTJ element, in a region where the resistance-area product RA is as high as 10 $\Omega\mu m^2$ or more, the MTJ element in which MgFeO is used for the tunnel barrier layer can obtain a higher MR ratio than the MTJ element in which MgO having no impurity added thereto is used for the tunnel barrier layer.

It is to be noted that, in the MTJ element according to this embodiment, boron (B) may be added to the MgFeO film of the tunnel barrier layer. As a result, interface oxidation of a magnetic material that is in contact with the tunnel barrier layer made of an oxide can be suppressed. Therefore, when the MgFeBO film is used for the tunnel barrier layer, deterioration of characteristics of the MTJ element due to oxidation of a magnetic layer can be suppressed. When B is added to the tunnel barrier layer having at least one element selected from a group including Mn, Ti, Cu, and V added thereto, the same effect can be obtained.

A description will now be given as to a reason why the MTJ element in which MgO having Fe added thereto is used for the tunnel barrier layer can obtain a high MR ratio in a high-resistance region.

Figure 6:
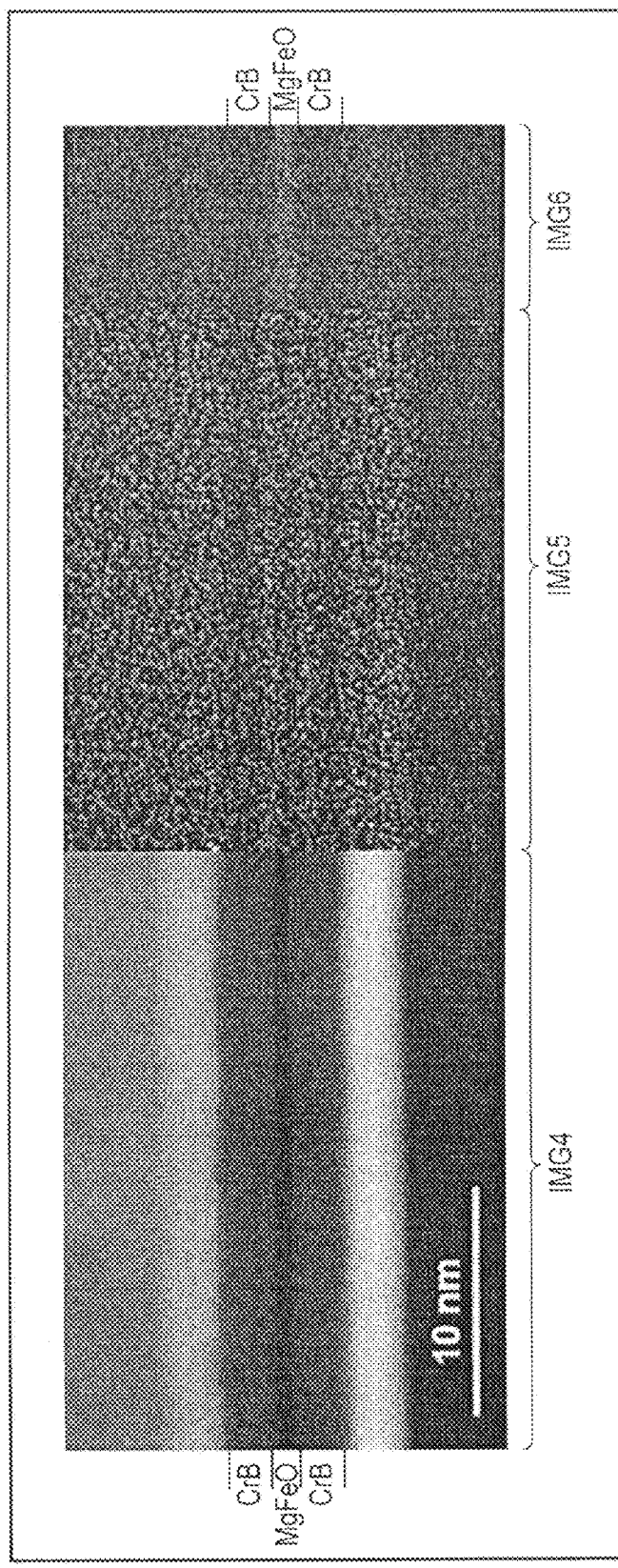
FIG. 6 is a view showing an analysis result of the magnetoresistive element according to the embodiment.

FIG. 6 shows a result of STEM for the MTJ element according to this embodiment.

Here, an MgFeO film as the tunnel barrier layer in the MTJ element analyzed in FIG. 6 is formed by the sputtering method using an MgFeO target in which Mg and Fe has a composition ratio of 4:1.

Here, a CrB/MgFeO/CrB structure is adopted for a magnetic tunnel junction used for an STEM analysis to facilitate the analysis of Fe based on EDX.

An analysis result IMG4 in FIG. 6 shows an HAADF image of the CrB/MgFeO/CrB structure.

An analysis result IMG5 in FIG. 6 shows a characteristic X-ray signal of a K shell of Fe in the CrB/MgFeO/CrB structure analyzed by the EDX. Each white point in the analysis result (an EDX image) IMG5 represents the characteristic X-ray signal of the K-shell of Fe.

An analysis result IMG6 in FIG. 6 shows a characteristic X-ray signal of a K shell of Mg in the CrB/MgFeO/CrB structure analyzed by the EDX. Each white point in the analysis result (an EDX image) IMG6 represents the characteristic X-ray signal of the K-shell of Mg.

In the analysis result IMG4 in FIG. 6, the darkest portion at the center in the HAADF image represents MgFeO.

Furthermore, in FIG. 6, as shown in the analysis result IMG5 representing the EDX image, many white points corresponding to the characteristic X-ray signals of the K shell of Fe are detected at positions apart from the same straight line provided at a position of an MgFeO film as compared with a position of the MgFeO film in each of the analysis results IMG4 and IMG6.

As shown in the analysis results IMG5 and IMG6 in FIG. 6, when MgFeO is used for the tunnel barrier layer in the MTJ element, Fe is segregated at an interface between MgO and CrB as different from an analysis result of STEM when MgMnO is used for the tunnel barrier layer.

Differing from the case where MgMnO is used for the tunnel barrier layer, the STEM analysis result in FIG. 6 shows that, in the MgFeO that is used for the tunnel barrier layer, the number of atoms (Fe) segregated outside the MgO is larger than the number of atoms (Fe in this example) contained in the MgO. The concentration of Fe at the center of the MgFeO film is lower than the concentration of Fe at an end portion (an end edge, an interface) of the MgFeO film.

That is, when MgFeO is used for the tunnel barrier layer in the MTJ element, added Fe is segregated on an interface between the MgO (MgFeO) film and a magnetic layer as the recording layer/reference layer, e.g., an interface between the MgFeO film and a CoFeB (CrB) film, whereby the wettability of the MgFeO film is improved. Therefore, the flat magnetic layer is formed on the tunnel barrier layer (the MgFeO film).

Therefore, the flatness of the magnetic layer formed on the tunnel barrier layer made of MgFeO is improved, and the magnetic layer having excellent uniformity of a film thickness can be obtained.

In addition, when the uniform (homogeneous) magnetic layer is formed, deterioration of polarizability of the magnetic layer due to diffusion of an element caused between the upper electrode and the magnetic layer does not affect a position between the tunnel barrier layer and the magnetic layer. As a result, in the MTJ element according to this embodiment, the polarizability of the magnetic layer (a magnetic substance) is improved, and a high MR ratio of the MTJ element can be obtained in a region where a resistance-area product RA of the MTJ element is high.

As described above, the MgFeO film as the tunnel barrier layer is formed by the sputtering method using the MgFeO target. When the MgFeO target is used, a bias voltage Vdc of the sputtering apparatus can be reduced. When such a bias voltage Vdc is reduced, damage to the tunnel barrier layer caused by sputtering can be decreased, and a film quality of the tunnel barrier layer can be improved. As a result, the MR ratio of the MTJ element can be improved.

For example, when at least one of the recording layer and the reference layer used for the MTJ element contains the same element as an element (Fe, Mn, Ti, V, Cu, or B) added to the MgO film of the tunnel barrier layer according to this embodiment, the wettability between the tunnel barrier layer and the magnetic layer can be improved, and the uniformity (flatness) of the magnetic layer can be further improved.

It is to be noted that a film forming time of the tunnel barrier layer (the MgO film) having a predetermined film thickness based on the sputtering method using the MgFeO target is shorter than a film forming time of the tunnel barrier layer (the MgO film) having a predetermined film thickness based on the sputtering method using the MgO target. Therefore, a manufacturing time of a magnetic device including the MTJ element according to this embodiment is reduced.

When the MTJ element is formed by using the MgFeO target, a throughput of the magnetic device can be enhanced in addition to improving the element characteristics of the MTJ element. As a result, manufacturing cost of the magnetic device including the MTJ element according to this embodiment can be decreased.

When a speed of an operation and a storage capacity of an MRAM are increased, a resistance-area product of the MTJ element must be reduced due to assurance of a restriction in impedance matching and a write current.

As one method for reducing a resistance value (e.g., the resistance-area product) of the MTJ element, a film thickness of the tunnel insulating film is reduced.

When a film thickness of the MgO film used as the tunnel barrier layer is reduced, a crystal nucleus of MgO becomes unstable, and hence crystal growth of an MgO (001) plane is inhibited. As a result, formation of a high-quality MgO film becomes difficult, and a decrease in MR ratio of the MTJ element becomes obvious.

Therefore, in a conventional MTJ element using a tunnel barrier layer containing MgO as a main component, it is difficult to achieve both a reduction in a resistance value and improvement in an MR ratio of the MTJ element.

The MTJ element 1 according to this embodiment includes the MgO film having at least one selected from Mn, Ti, and V added thereto as the tunnel barrier layer. Alternatively, the MTJ element 1 according to this embodiment includes the MgFeO film having at least one selected from Mn, Ti, V, Cu, and B added thereto as the tunnel barrier layer.

In the MTJ element according to this embodiment, when at least one of Mn, Ti, Cu, and V is added to MgO as a main component of the tunnel barrier layer, a resistance value (a resistance-area product RA) of the MTJ element can be reduced, and reduction in an MR ratio of the MTJ element can be suppressed.

Moreover, in this embodiment, when Fe is added to MgO as a main component of the tunnel barrier layer, a higher MR ratio than that of the MTJ element using the MgO layer for the tunnel barrier layer can be obtained.

Based on the above-described results, when the MgO film (the MgFeMnO film) having Fe and Mn added thereto is used for the tunnel barrier layer of the MTJ element, the MTJ element having a high MR ratio with a low resistance-area product RA of 10 $\mu m^2$ or less can be formed.

It is to be noted that, in an MTJ element in which an MgO film (e.g., an MgTiO film) having at least one of Ti, V, and Cu added thereto with Fe in place of Mn is used for a tunnel barrier layer, the same effect as the MTJ element in which the MgFeMnO film is used for the tunnel barrier layer can be obtained.

As described above, according to the magnetoresistive element of this embodiment, the element characteristics of the magnetoresistive element can be improved.

(3) Application Example

An application example of the magnetoresistive element according to the embodiment will now be described with reference to FIG. 7 and FIG. 8. It is to be noted that like reference numerals denote substantially the same structures as those described in the foregoing embodiment, and a description thereof will be given as required.

The magnetoresistive element according to the embodiment is used as, e.g., a memory element of a magnetoresistive random access memory (MRAM). In this application example, a spin-torque transfer (STT) MRAM will be exemplified.

Figure 7:
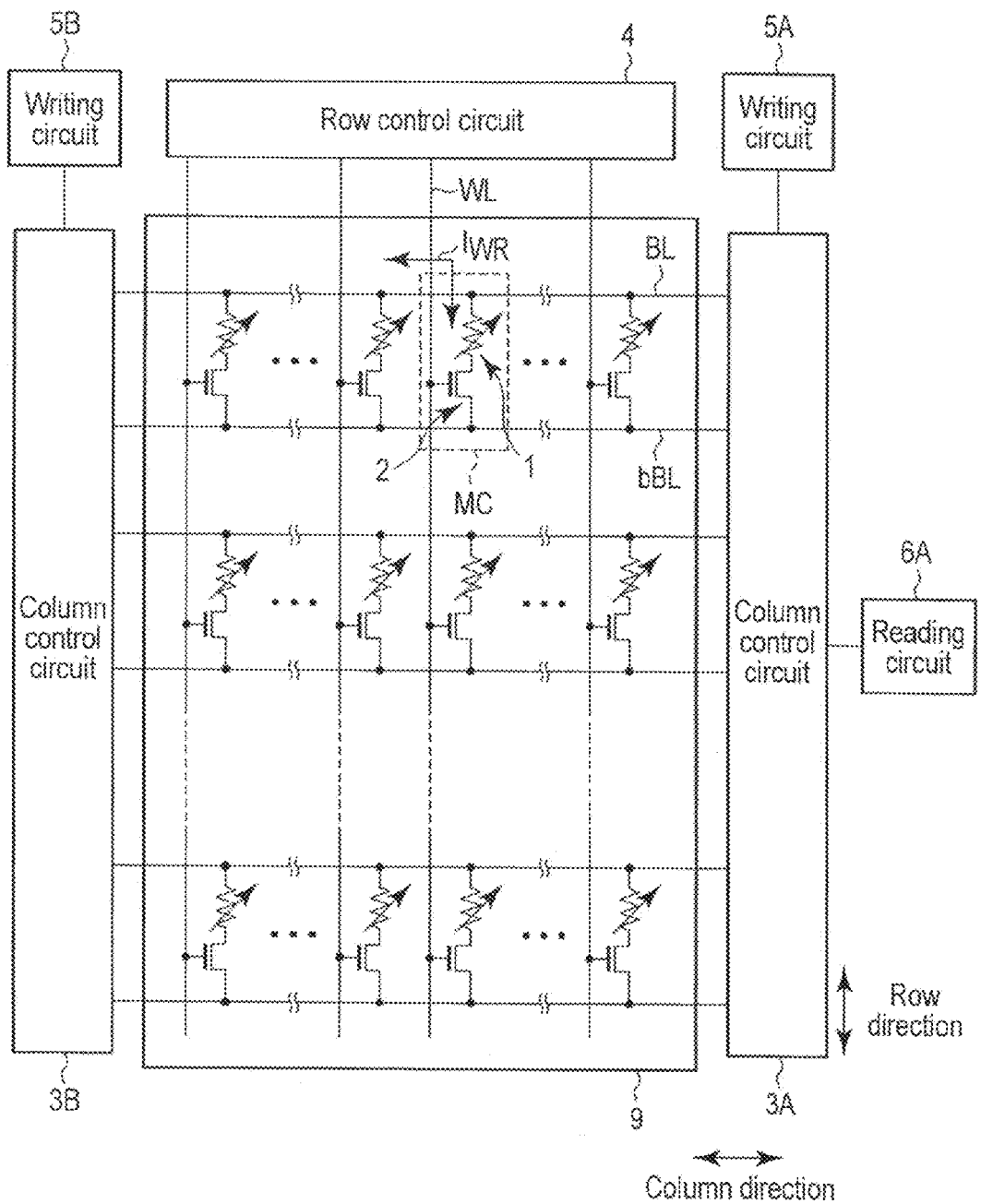
FIG. 7 and FIG. 8 are views each showing an application example of the magnetoresistive element according to the embodiment.

FIG. 7 is a view showing a memory cell array of an MRAM and nearby circuit configurations according to this application example.

As shown in FIG. 7, a memory cell array 9 includes memory cells MC.

The memory cells MC are arranged in an array form in the memory cell array 9. Bit lines BL and bBL and word lines WL are provided in the memory cell array 9. The bit lines BL and bBL extend in a column direction, and the word lines WL extend in a row direction. Two bit lines BL and bBL form a pair of bit lines.

The memory cell MC is connected to the bit lines BL and bBL and the word line WL.

The memory cells MC arranged in the column direction are connected to a common pair of bit lines BL and bBL. The memory cells MC arranged in the row direction are connected to a common word line WL.

Each memory cell MC includes, e.g., one magnetoresistive element (an MTJ element) 1 as a memory element and one selection switch 2. As the MTJ element 1 in the memory cell MC, the magnetoresistive element (the MTJ element) 1 described in the embodiment is used.

The selection switch 2 is, e.g., a field effect transistor. The field effect transistor as the selection switch 2 will be referred to as a select transistor 2 hereinafter.

One end of the MTJ element 1 is connected to the bit line BL, and the other end of the MTJ element 1 is connected to one end (a source/a drain) of a current path of the select transistor 2. The other end (the source/the drain) of the current path of the select transistor 2 is connected to the bit line bBL. A control terminal (a gate) of the select transistor 2 is connected to the word line WL.

One end of the word line WL is connected to a row control circuit 4. The row control circuit 4 controls activation/inactivation of each word line based on an address signal supplied from the outside.

One end and the other end of each of the bit lines BL and bBL are connected to column control circuits 3A and 3B. The column control circuits 3A and 3B control activation/inactivation of the bit lines BL and bBL based on the address signal supplied from the outside.

Writing circuits 5A and 5B are connected to one end and the other end of the bit lines BL and bBL through the column control circuits 3A and 3B. Each of the writing circuits 5A and 5B has a source circuit such as a current source or a voltage source configured to generate a write current $I_{WR}$ and a sink circuit configured to absorb the write current.

In the STT type MRAM, at the time of writing data, each of the writing circuits 5A and 5B supplies the write current $I_{WR}$ to a memory cell selected from the outside (which will be referred to as a selected cell hereinafter).

At the time of writing data into the MTJ element 1, each of the writing circuits 5A and 5B allows the write current $I_{WR}$ to bi-directionally flow through the MTJ element 1 in the memory cell MC in accordance with the data written into the selected cell. That is, the write current $I_{WR}$ flowing from the bit line BL to the bit line bBL or the write current $I_{WR}$ flowing from the bit line bBL to the bit line BL is output from each of the writing circuits 5A and 5B in accordance with the data written into the MTJ element 1.

A reading circuit 6A is connected to the bit lines BL and bBL through the column control circuit 3A. The reading circuit 6A includes a voltage source or a current source that generates a read current, a sense amplifier that detects and amplifies a read signal, a latch circuit that temporarily holds data, and others. At the time of reading data from the MTJ element 1, the reading circuit 6A supplies a read current to the selected cell. A current value of the read current is smaller than a current value (a magnetization reversal threshold value) of the write current so that the magnetization of the recording layer is not reversed by the read current.

A current value or a potential in a read node differs depending on an intensity of a resistance value of the MTJ element 1 to which the read current has been supplied. Data stored in the MTJ element 1 is determined based on a fluctuation amount (a read signal, a read output) associated with the intensity of the resistance value.

It is to be noted that the reading circuit 6A is provided on one end side of the memory cell array 9 in the column direction in the example shown in FIG. 7, but two reading circuits may be provided at one end and the other end of the memory cell array 9 in the column direction.

For example, a buffer circuit, state machine (a control circuit), or an error checking and correcting (ECC) circuit, and others may be provided in the same chip as the memory cell array 9.

Figure 8:
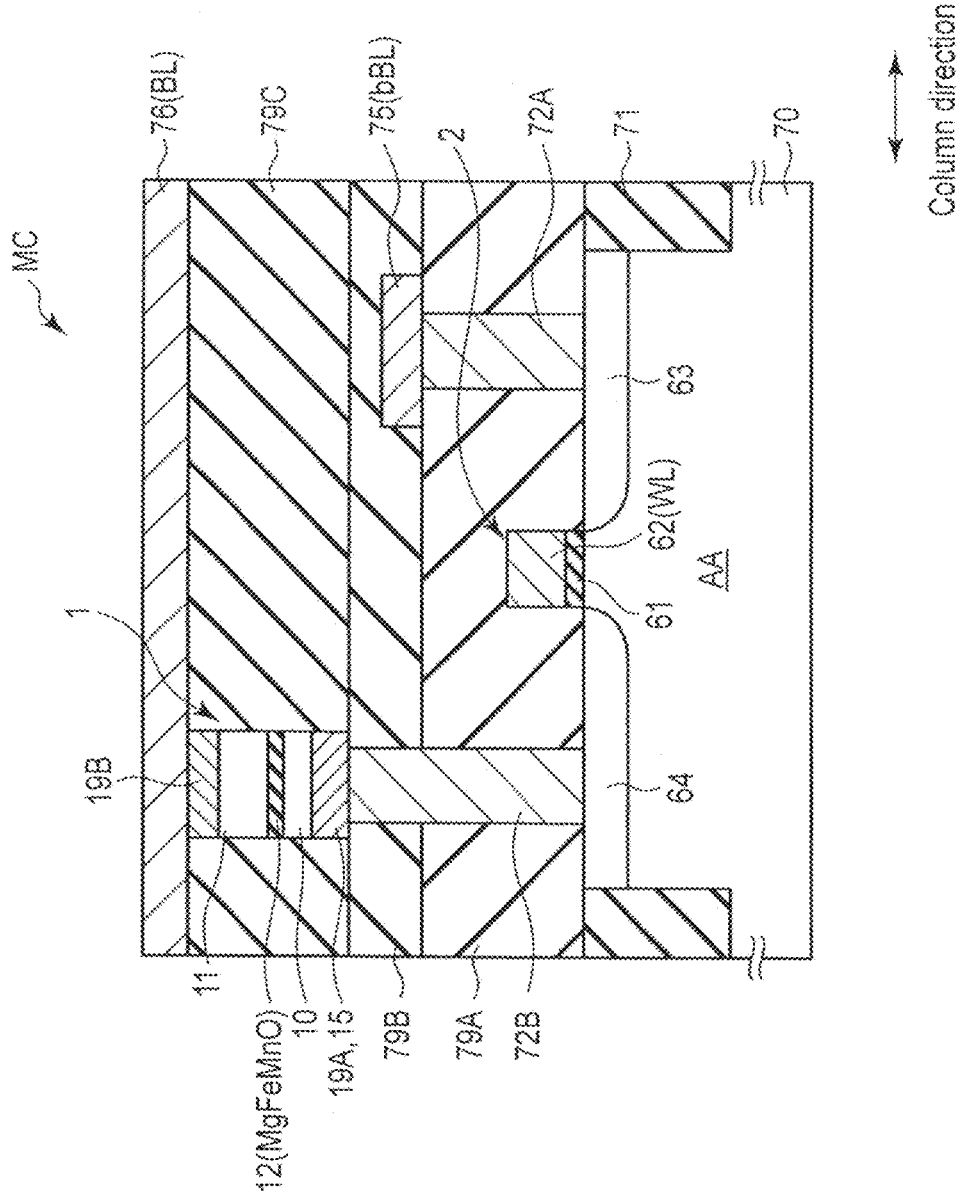

FIG. 8 is a cross-sectional view showing an example of a configuration of a memory cell MC provided in the memory cell array 9 of the MRAM according to this application example.

The memory cell MC is formed in an active area AA of a semiconductor substrate 70. The active area AA is partitioned by each insulating film 71 buried in an element isolation area of the semiconductor substrate 70.

A surface of the semiconductor substrate 70 is covered with stacked interlayer insulating films 79A, 79B, and 79C.

The MTJ element 1 is provided in the interlayer insulating film 79. An upper end of the MTJ element 1 is connected to a bit line 76 (BL) through an upper electrode 19B. Furthermore, a lower end of the MTJ element 1 is connected to a source/drain diffusion layer 64 of the select transistor 2 through a lower electrode 19A including an under layer 15 and a contact plug 72B buried in the interlayer insulating films 79A and 79B. A source/drain diffusion layer 63 of the select transistor 2 is connected to a bit line 75 (bBL) through a contact plug 72A in the interlayer insulating film 79A.

A gate electrode 62 is formed on a surface of the active area AA between the source/drain diffusion layer 64 and the source/drain diffusion layer 63 through a gate insulating film 61. The gate electrode 62 extends in the row direction, and it is used as the word line WL.

It is to be noted that the MTJ element 1 is provided immediately above the plug 72B, but it may be arranged at a position deviating from the position immediately above the contact plug (e.g., above the gate electrode of the select transistor) by using an intermediate interconnect layer.

FIG. 8 shows an example where one memory cell is provided in one active area AA. However, two memory cells may be provided in one active area AA in such a manner that the two memory cells are adjacent to each other in the column direction to share one bit line bBL and the source/drain diffusion layer 63.

Although FIG. 8 shows a field effect transistor having a planar structure as the select transistor 2, the structure of the field effect transistor is not restricted thereto. For example, like a recess channel array transistor (RCAT) or a FinFET, a field effect transistor having a three-dimensional structure may be used as the select transistor. The RCAT has a structure in which a gate electrode is buried in a recess in a semiconductor region through a gate insulating film. The FinFET has a structure in which a gate electrode three-dimensionally crosses a strip-like semiconductor region (a fin) through a gate insulating film.

The MTJ element 1 according to this embodiment is used as a memory element of the MRAM. In the MTJ element 1 in the memory cell MC, an MgFeO film containing at least one of Mn, Ti, V, Cu, and B (e.g., an MgFeMnO film) is used for a tunnel barrier layer 12. As a result, according to the MTJ element of this embodiment, a resistance value of the MTJ element 1 can be reduced, and an MR ratio of the MTJ element 1 can be increased. It is to be noted that an MgO film containing at least one of Mn, Ti, and V (e.g., an MgMnO film) may be used for the tunnel barrier layer 12 of the MTJ element 1. For example, in the MTJ element according to the embodiment, an MgFeO film or an MgO film having an impurity X (e.g., at least one of elements Ti, V, Mn, B, and Cu) in the tunnel barrier layer added thereto includes at least one of a fine crystal phase and an amorphous phase.

In the MTJ element 1 according to this embodiment, since a resistance value of the element can be reduced, parasitic resistance due to the element can be reduced, and a speed of an operation of the MRAM can be increased.

Therefore, when the MRAM is formed by using the MTJ element according to the embodiment, data read characteristics of the MRAM can be improved.

Accordingly, a magnetic memory including the magnetoresistive element according to the embodiment can improve operational characteristics thereof.

[Other]

In the magnetoresistive element according to the embodiment, a perpendicular magnetic film has been exemplified. However, when an MgO film having at least one of Mn, Ti, and V added thereto or an MgFeO film having at least one of Mn, Ti, V, Cu, and B added thereto is used for the tunnel barrier layer in the MTJ element, the above-described effect can be obtained even in a case where a parallel magnetic film (an in-plane magnetic film) having a magnetization direction facing a direction parallel to a film surface of the magnetic layer is used in the magnetic layer corresponding to each of a recording layer and a reference layer sandwiching the tunnel barrier layer in the MTJ element.

In the magnetoresistive element according to the embodiment, the example depicted in FIG. 1 shows the top pin type MTJ element in which the reference layer 11 is stacked above the recording layer 10. However, the magnetoresistive element according to the embodiment may be a bottom pin type MTJ element in which the recording layer 10 is stacked above the reference layer 11.

The magnetoresistive element according to the embodiment may be applied to a magnetic memory other than the MRAM.

The magnetic memory adopting the magnetoresistive element according to the embodiment can be used in place of memories such as DRAM and SRAM. The magnetic memory adopting the magnetoresistive element according to the embodiment can also be used as a cache memory of a storage device such as a solid state drive (SSD).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
a first magnetic layer;
an MgFeO layer; and
a second magnetic layer stacked in a first direction, the MgFeO layer disposed between the first and second magnetic layers; wherein
Fe of the MgFeO layer is included at least in a central portion of the MgFeO layer in the first direction, and
the MgFeO layer contains at least one element selected from a group consisting of Ti, V, Mn, and Cu.

2. The element according to claim 1,
wherein at least one of the first and second magnetic layers includes Fe.

3. The element according to claim 1,
wherein at least one of the first and second magnetic layers includes a same metal element as a metal element contained in the MgFeO layer.

4. The element according to claim 1,
wherein at least one of a concentration of Fe in a region between the first magnetic layer and the MgFeO layer and a concentration of Fe in a region between the second magnetic layer and the MgFeO layer is higher than a concentration of Fe at the central portion of the MgFeO layer.

5. The element according to claim 1,
wherein the MgFeO layer includes at least one of a fine crystal phase and an amorphous phase.

6. The element according to claim 1,
wherein the MgFeO layer further includes boron.

7. A magnetic memory comprising a memory cell including the magnetoresistive element according to claim 1.

8. A magnetoresistive element comprising:
a first magnetic layer;
an MgFeO layer; and
a second magnetic layer stacked in a first direction, the MgFeO layer disposed between the first and second magnetic layers; wherein
Fe of the MgFeO layer is included at least in a central portion of the MgFeO layer in the first direction, and
the MgFeO layer contains boron.

9. The element according to claim 8,
wherein at least one of the first and second magnetic layers includes Fe.

10. The element according to claim 8, wherein at least one of a concentration of Fe in a region between the first magnetic layer and the MgFeO layer and a concentration of Fe in a region between the second magnetic layer and the MgFeO layer is higher than a concentration of Fe at the central portion of the MgFeO layer.

11. The element according to claim 8,
wherein the MgFeO layer includes at least one of a fine crystal phase and an amorphous phase.

12. A magnetic memory comprising a memory cell including the magnetoresistive element according to claim 8.

13. A magnetoresistive element comprising:
a first magnetic layer having a variable magnetization direction;
a second magnetic layer having an invariable magnetization direction; and
a tunnel barrier layer provided between the first magnetic layer and the second magnetic layer and including an MgFeO layer, wherein
Fe of the MgFeO layer is included at least in a central portion of the MgFeO layer in a thickness direction,
at least one of a concentration of Fe in a region between the first magnetic layer and the MgFeO layer and a concentration of Fe in a region between the second magnetic layer and the MgFeO layer is higher than a concentration of Fe at the central portion of the MgFeO layer, and
the MgFeO layer contains at least one element selected from a group consisting of Ti, V, Mn, and Cu.

14. A magnetoresistive element comprising:
a first magnetic layer having a variable magnetization direction;
a second magnetic layer having an invariable magnetization direction; and
a tunnel barrier layer provided between the first magnetic layer and the second magnetic layer and including an MgFeO layer, wherein
Fe of the MgFeO layer is included at least in a central portion of the MgFeO layer in a thickness direction,
at least one of a concentration of Fe in a region between the first magnetic layer and the MgFeO layer and a concentration of Fe in a region between the second magnetic layer and the MgFeO layer is higher than a concentration of Fe at the central portion of the MgFeO layer, and
the MgFeO layer contains boron.

* * * * *